United States Patent [19]
Liu

[11] Patent Number: 5,399,879
[45] Date of Patent: Mar. 21, 1995

[54] LONG WAVELENGTH IR PHOTO-INDUCED SWITCHING OF A RESONANT TUNNELLING DIODE USING THE INTERSUBBAND TRANSITION

[75] Inventor: Hui C. Liu, Orleans, Canada

[73] Assignee: National Research Council of Canada, Ottawa, Canada

[21] Appl. No.: 14,340

[22] Filed: Feb. 5, 1993

[51] Int. Cl.$^6$ .............................................. H01L 27/14
[52] U.S. Cl. ........................................ 257/14; 257/21; 257/25; 257/184; 257/196; 365/175
[58] Field of Search ................. 257/113, 184, 196, 21, 257/25, 14; 365/175

[56] References Cited

U.S. PATENT DOCUMENTS 4,868,418 9/1989 Imamura et al. ................. 257/25 X
4,952,792 8/1990 Caridi ................................ 257/21 X

FOREIGN PATENT DOCUMENTS 3-284876 12/1991 Japan ..................................... 257/25

OTHER PUBLICATIONS

Liu et al., "Intersubband Photocurrent from the Quantum Well of an Asymmetrical Double-Barrier Structure," *J. Appl. Phys.* 70(2), 15 Jul. 1991, pp. 935-940.
Liu, "Long Wavelength Infrared Quantum Well Devices for Optical Signal Processing and Optical Processing and Optical Computing," The 2nd IEEE International Workshop on Photonics, Devices and Applications, 9-11 Mar. 1992, Montebello, Canada, pp. 1-5.
Liu et al., "Long Wavelength Infrared Photo-Induced Switching of a Resonant Tunneling Diode Using the Intersubband Transition," IEEE Electron Devices Letters, Jul., 1992, pp. 1-11.
Zou et al., "Effects of Asymmetric Barriers on Resonant Tunnelling Current," IOP Publishing, Ltd., 1988, pp. 819-822.
Bolognesi et al., "Valley Current Density Activation Energy and Effective Longitudinal Optical Phonon Energy in Triple Well Asymmetric Resonant Tunneling Diode", *Appl. Phys. Lett.*, 57(6), 6 Aug. 1990, pp.575-577.

*Primary Examiner*—William Mintel
*Attorney, Agent, or Firm*—Pascal & Associates

[57] ABSTRACT

An optical switching device is comprised of an asymmetrical double barrier resonant tunnelling diode (RTD) connected in series with load resistance apparatus to a power source, apparatus for illuminating the RTD with an infrared incident light beam, apparatus for applying signal power to the RTD, and apparatus for varying the power within the RTD.

18 Claims, 3 Drawing Sheets

LONG WAVELENGTH IR PHOTO-INDUCED SWITCHING OF A RESONANT TUNNELLING DIODE USING THE INTERSUBBAND TRANSITION

FIELD OF THE INVENTION

This invention relates to optical switching devices and particularly to optical devices using double barrier resonant tunnelling diodes biased to a bistable region thereof.

BACKGROUND TO THE INVENTION

A double barrier resonant tunnelling diode (RTD) is a semiconductor device having a sandwich construction, in which a middle section is formed of a thin (nanometers) narrow bandgap semiconductor such as GaAs between wider bandgap semiconductors such as AlGaAs. Because of the bandgap difference, a potential well is formed in the conduction band and/or the valence band. The electron or hole motions in the thin well are confined in the growth region, leading to a set of quantized states, which gives rise to the term "quantum well". Because of the layered nature of the device, the in-plane electron or hole motion is still free and one quantum state can be occupied by many electrons or holes, giving rise to the term "subband". Intersubband transitions are direct optical and radiative transitions between these subband states.

RTDs have been used in high frequency applications; for example, oscillations at frequencies up to 712 GHz, trigger circuits up to 110 GHz and harmonic multiplications up to 320 GHz have been demonstrated. Logic circuit applications have also been proposed, and as well switching time of less than 2 ps has been measured.

SUMMARY OF THE PRESENT INVENTION

According to the present invention, an RTD is used to achieve an optical switch; light is used to control light transmission and voltage across the RTD, and optical bistability is achieved.

In accordance with an embodiment of the invention, an optical switching device is comprised of an asymmetrical double barrier resonant tunnelling diode (RTD) connected in series with a load resistor to a power source; the RTD is illuminated with an infrared incident light beam, signal power is applied to the RTD, and means is included for varying the signal power within the RTD.

According to another embodiment, the signal power is provided by an optical signal.

In accordance with another embodiment, the signal power is provided by an electrical signal which is detected across one of the load resistor and the RTD.

BRIEF INTRODUCTION TO THE DRAWINGS

A better understanding of the invention will be obtained by reference to the detailed description below, in conjunction with the following drawings, in which:

FIG. 1 is a schematic diagram of an embodiment of the invention,

FIG. 2 is a sectional view of an RTD device in accordance wit an embodiment of the invention, FIGS. 3A and 3B are a current-voltage characteristic graph and an intersubband absorption coefficient ($\alpha$) vs input long wave infrared (LWIR) power of incident light graph respectively of an embodiment of the invention, FIGS. 4A and 4B are a current vs voltage graph, and a voltage across an RTD vs input infrared power graph respectively of another embodiment of the invention, and FIG. 4C is a graph of the intersubband absorption coefficient vs the input infrared power for the hysteresis device described with reference to FIGS. 4A and 4B.

DETAILED DESCRIPTION OF THE INVENTION

Figure 1:
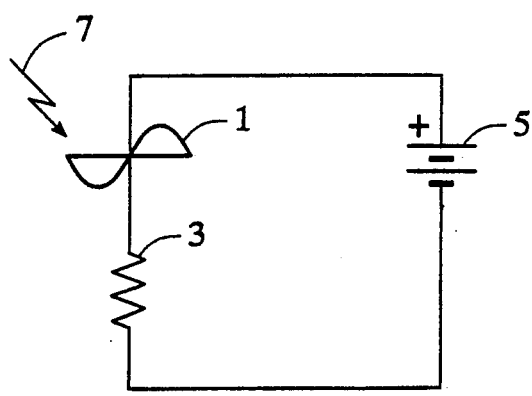

Turning to FIG. 1, in accordance with an embodiment of the invention, an RTD device 1 is connected in series with a load resistor 3 and a power source 5. The cross-section in FIG. 1 is schematic only, and a person skilled in the art would understand that, for example, light confining layers could be added for waveguiding. An infrared incident light beam 7 is applied against the device 1.

In a successful prototype, P-polarized illumination from a continuous wave $CO_2$ laser operated at 9.3 $\mu$m, which is close to the intersubband transition peak was used as the incident light beam. The RTD device was $120 \times 120$ $\mu m^2$, and up to 300 milliwatts of the incident light beam was used.

Figure 2:
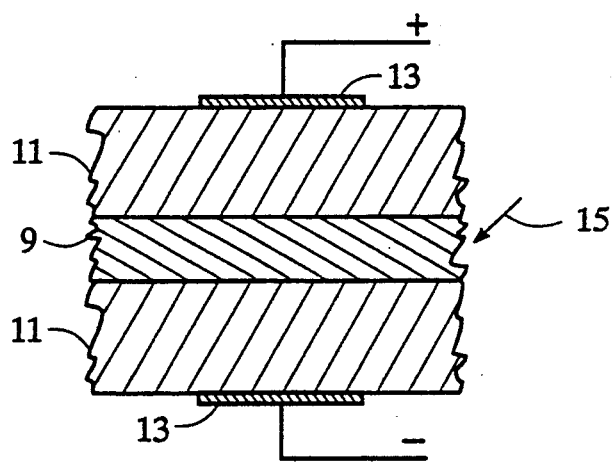

FIG. 2 illustrates a cross-section of the RTD device. An inner layer 9 was formed of GaAs and was 6.0 nm in thickness. Outer layers 11 were 12.6 nm and 9.0 nm respectively, and were formed of $Al_{0.33} Ga_{0.67}$ As. Contact GaAs layers 13 were doped with Si to about $2 \times 10^{18}$ cm$^{-3}$. 120 $\mu$m square mesa devices near a 45° polished edge facet were used to provide for coupling of an input optical signal 15 into the inner layer 9. The sample was mounted in a liquid nitrogen cryostat and the device temperature was about 80K.

For single mode waveguides, the confining dimensions should be smaller than the wavelength in the material. Low loss waveguides must be smoothed on a length scale many times smaller than the wavelength in the material.

Figure 3A:
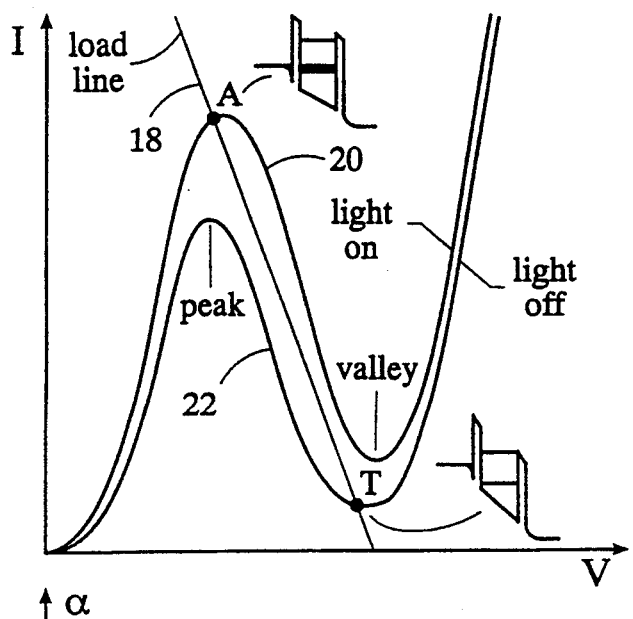
Figure 3B:
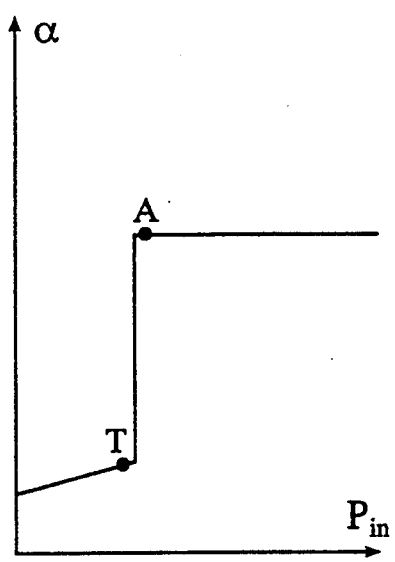

Turning now to FIGS. 3A and 3B, the current-voltage I-V curve of a double barrier resonant tunnelling diode is shown; the region of negative differential resistance, and a load line 18 are shown.

In accordance with one embodiment of the invention, the resistance of the load is approximately equal to the magnitude of the negative differential resistance of the I-V characteristics. The I-V characteristics are different with the light on and the light off; characteristic 20 is shown, with the incident light beam 15 on, which is different from characteristic 22 which the is the characteristic with the incident light beam 15 off. With the load resistance 3 approximately equal to the negative differential resistance of the two I-V-characteristics 20 and 22 and with D.C. bias applied across the diode 1 from the power source 5, the load line takes the position shown in FIG. 3A. It may be seen that the load line 18 intersects characteristic 20 at point A and intersects the valley of characteristic 22 at point T.

At the peak region, e.g. at point A, the optical signal 15 is absorbed. At valley region, at point T, the inner layer 9 is transparent to the optical signal 15. In FIG. 3B, the intersubband absorption coefficient ($\alpha$) vs the incident light beam infrared power ($P_{in}$) is shown, for some applied external bias near the negative differential resistance region. Thus it may be seen that by varying the incident light beam 15, the optical signal power transmission through the inner layer 9 can be controlled.

Figure 4C:
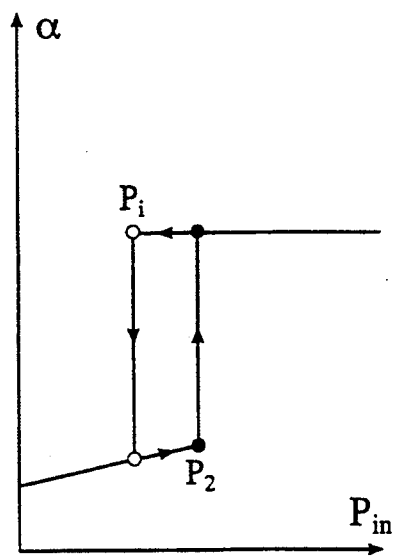
Figure 4A:
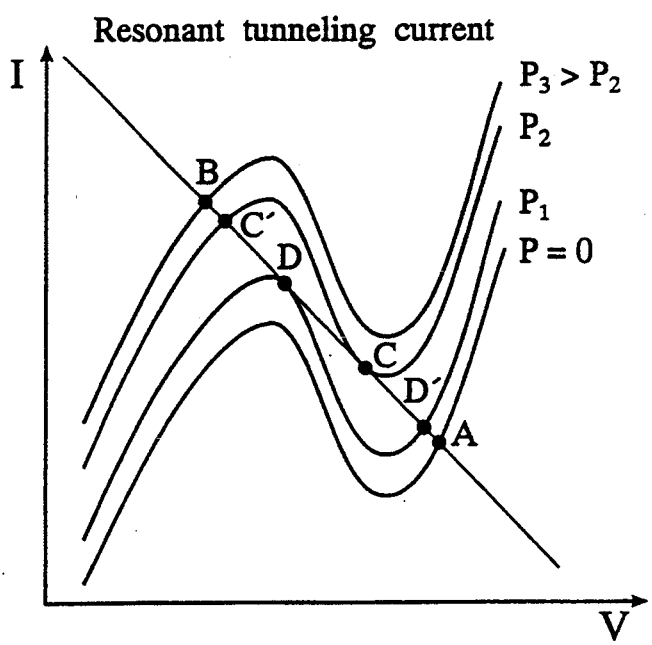
Figure 4B:
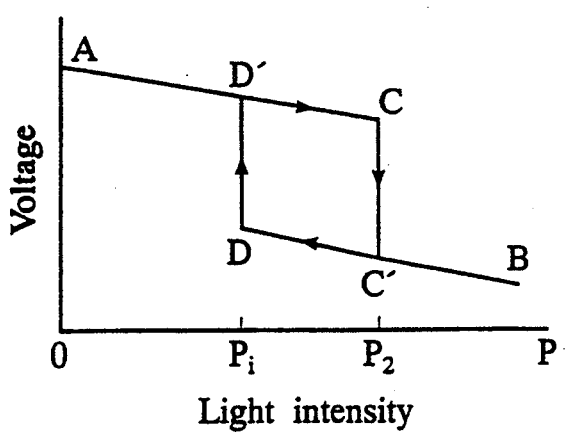

If the load resistor 3 is made larger than the negative differential characteristic, an optical memory illustrating bistability (hysteresis) can be made. Reference is made to FIGS. 4A, 4B and 4C, FIG. 4A showing a load line with such load resistor, on a graph of I-V characteristics resulting from different powers of incident light. Because of the way the load line intersects the I-V-curves at different infrared light beam power levels, the low-to-high absorption switching occurs at incident light power $P_2$ when incident light power $P_{in}$ is increased from zero. But the high-to-low switching occurs at $P_1$ for decreasing $P_{in}$ from some higher value. Because $P_1 < P_2$, optical bistability is achieved.

More particularly, four different increasing incident power levels are shown: $P=0$, $P_1$, $P_2$ and $P_3$ respectively. As the incident infrared light beam power is increased from 0 to $P_2$, the voltage across the device will decrease, following the change in the valley region voltage with light intensity (A to C in FIG. 4B). Once the incident light beam power has been increased slightly above $P_2$, however, the load line no longer touches the I-V characteristic near the valley, and the voltage must switch to the lower value where the load line intersects the characteristic near the current peak (C to C'). The voltage decreases with increasing power thereafter (C' to B). If the incident light beam power is then decreased once more, the diode voltage will follow the peak region to some power below $P_2$ where the previous switching event occurred, since the load line continues to intersect the characteristic at the current peak region until $P_1$. Low to high voltage switching (D to D') will occur when the laser power is reduced below $P_1$. Since $P_2 > P_1$, we have thus achieved a hysteresis loop voltage vs incident power as illustrated in FIG. 4B.

In accordance with another embodiment, with resistor 3 being small (e.g. 50 ohms used in a successful embodiment), oscillation of the resonant tunnelling diode occurs. Varying the incident laser beam power creates a change in the natural frequency of the oscillation. Thus infrared detection that converts light intensity to a frequency change occurs by detection of the oscillating voltage across either the device 1 or the load resistor 3.

In accordance with another embodiment, the incident light beam was chopped at a frequency close to the natural frequency of the oscillating RTD at the particular incident light beam 15 power. Phase locking between the circuit self-oscillation frequency and the chopping frequency occurs. Thus a stable controllable oscillator was achieved, controlled by the incident light beam 15.

In addition, the above phenomena can be used to modulate optical signal 15 which could be applied to inner layer 9.

While the value of the load resistor 3 noted above was given for a successful prototype that was achieved, to use the RTD as a detector, in general the value of the load resistor 3 is preferred to be smaller than the negative differential resistance so that the device 1 would be biased into the positive resistance region at voltages and currents below the peak A (FIG. 3A).

By using a load resistor 3 which is smaller than the negative differential resistance and bias as described in the paragraph above, a detector is formed, 15 which can be used to convert optical signal 15 to an electrical signal by measuring the voltage across device 1 or load resistor 3.

The switching scheme described earlier with respect to FIG. 3A can also be used for converting an electrical signal (i.e. the signal from power source 5) to an optical signal by causing it to modulate an optical signal 15.

The embodiments described above can be used as components for optical signal processing or optical computing.

A person understanding this invention may now conceive of alternative structures and embodiments or variations of the above. All of those which fall within the scope of the claims appended hereto are considered to be part of the present invention.

I claim:

1. An optical switching device comprising an asymmetrical double barrier resonant tunnelling diode (RTD) connected in series with load resistance means to a power source, means for illuminating the RTD with an infrared incident light beam, means for applying signal power to the RTD, and means for varying said signal power within the RTD.

2. A device as defined in claim 1 in which the light beam is monochromatic.

3. A device as defined in claim 2 in which the RTD is formed of a sandwich structure comprised of semiconductor material of a type having a first bandgap contained between semiconductor layers having a second bandgap which is wider than the first bandgap, whereby a quantum well is produced.

4. A device as defined in claim 3 in which the signal power is an optical signal.

5. A device as defined in claim 3 in which the signal power is received from said power source, and further including means for detecting an output signal voltage across one of said load resistance means and said RTD.

6. A device as defined in claim 5 in which the resistance of said load resistance means is sufficiently small so as to cause the RTD to oscillate, and means for varying the power of the incident light beam so as to cause the oscillation frequency of the RTD to vary.

7. A device as defined in claim 5 in which the resistance of said load resistor is sufficiently small so as to cause the RTD to oscillate, and means for chopping the incident light beam at a frequency close to a natural oscillating frequency of the RTD.

8. A device as defined in claim 5, in which the resistance of the load resistance means is approximately equal to the magnitude of a negative differential resistance of the current-voltage relationship of the RTD.

9. A device as defined in claim 5, in which the resistance of the load resistance means is greater than the magnitude of a negative differential resistance of a current-voltage relationship of the RTD, whereby a bistable device with hysteresis is formed.

10. A device as defined in claim 4 in which the resistance of said load resistance means is sufficiently small so as to cause the RTD to oscillate, and means for varying the power of the incident light beam so as to cause the oscillation frequency of the RTD to vary.

11. A device as defined in claim 4 in which the resistance of said load resistance means is sufficiently small as to cause the RTD to oscillate, and means for chopping the incident light beam at a frequency close to a natural oscillating frequency of the RTD.

12. A device as defined in claim 4, in which the resistance of the load resistance means is approximately equal to the magnitude of a negative differential resistance of the current-voltage relationship of the RTD.

13. A device as defined in claim 4, in which the resistance of the load resistance means is greater than the magnitude of a negative differential resistance of the current-voltage characteristic of the RTD, whereby a bistable device with hysteresis is formed.

14. A device as defined in claim 4, in which the resistance of the load resistance means is smaller than the magnitude of a negative differential resistance of the current-voltage characteristic of the RTD and having a load line in a positive resistance region of the current-voltage characteristic thereof, means for varying the incident light beam between minimum and maximum voltage switching points of a hysteresis voltage vs incident power characteristic of the RTD, and detecting a signal voltage across one of said load resistor and the RTD.

15. A device as defined in claim 4, in which the resistance of the load resistance means is smaller than the magnitude of a negative differential resistance of the current-voltage characteristic of the RTD, and having a load line in a positive resistance region of the current-voltage characteristic thereof, means for varying the incident light beam between predetermined minimum and maximum power levels of an intersubband absorption coefficient vs incident light beam characteristic of the RTD, whereby the intensity of optical power carried by said intermediate layer with said incident power is varied with hysteresis.

16. A device as defined in claim 15, forming a memory element.

17. A device as defined in claim 15, forming a detector.

18. A device as defined in claim 7, forming a phase locked oscillator.

* * * * *